United States Patent [19]

Rohlev

[11] Patent Number: 4,935,108
[45] Date of Patent: Jun. 19, 1990

[54] APPARATUS FOR TROUBLESHOOTING PHOTOIMAGE PLATING PROBLEMS IN PRINTED CIRCUIT BOARD MANUFACTURING

[75] Inventor: Slav A. Rohlev, Ft. Collins, Colo.

[73] Assignee: Hewlett-Packard Company, Palo Alto, Calif.

[21] Appl. No.: 344,782

[22] Filed: Apr. 28, 1989

[51] Int. Cl.⁵ .................. C25D 5/02; C25D 17/00
[52] U.S. Cl. ................................... 204/15; 204/434
[58] Field of Search ..................... 204/1 T, 15, 434

[56] References Cited

PUBLICATIONS

Nohse, Walter, "The Hull Cell", *Robert Draper LTD, 1966*, pp. 1-25.

Englemaier, Werner; Kessler, Thomas; Alkire, Richard; "Current Distribution Leveling Resulting from Auxiliary Bipolar Electrodes", *Journal of Electrochemical Society; Electrochemical Science and Technology,* pp. 209-216, Feb. 1978.

Rohlev, S.; Pierce, P; Yost, C.; Meck, M; "Effect of Composition on Current and Metal Distribution and Efficiency in a Gold Plating Solution", *The Electrochemical Society Extended Abstracts*, pp. 793-794, Oct. 11-16, 1981.

*Primary Examiner*—T. M. Tufariello
*Attorney, Agent, or Firm*—Guy J. Kelley

[57] ABSTRACT

An apparatus and method are disclosed for testing electrodeposition processes used in printed circuit board manufacture. The apparatus, having a photoresist pattern on a test printed circuit board, for use in a Hull Cell to determine efficiency, uniformity, and interactions of the process on the surface of the printed circuit board in order to provide for design rules and process specifications.

24 Claims, 9 Drawing Sheets

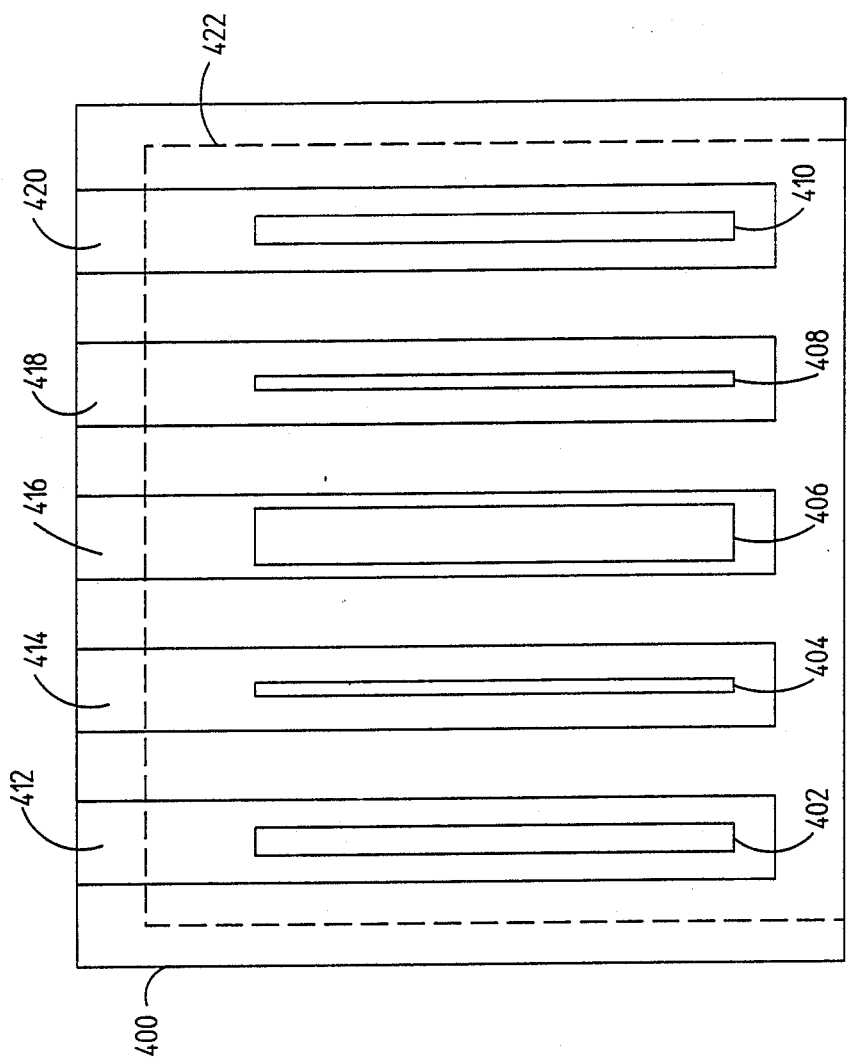

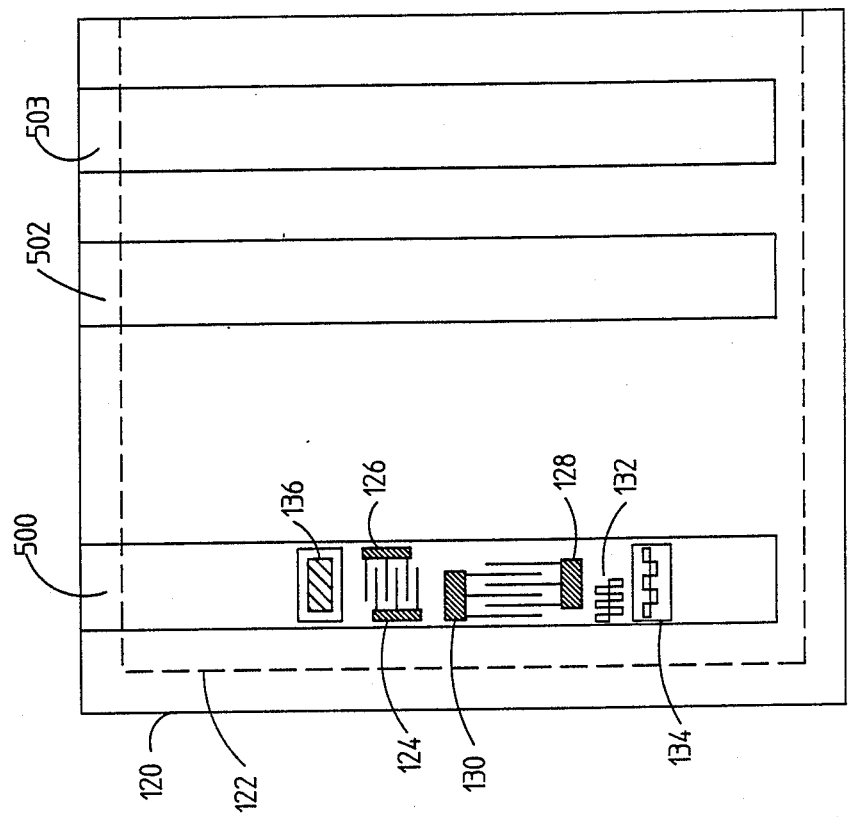

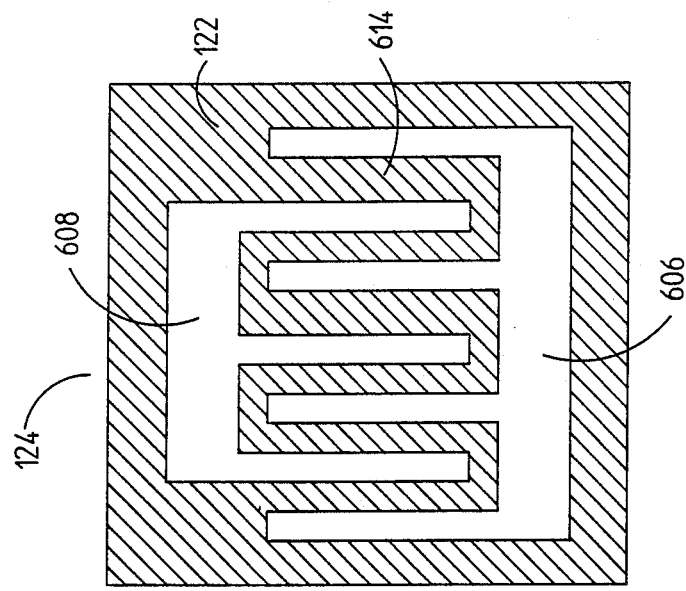
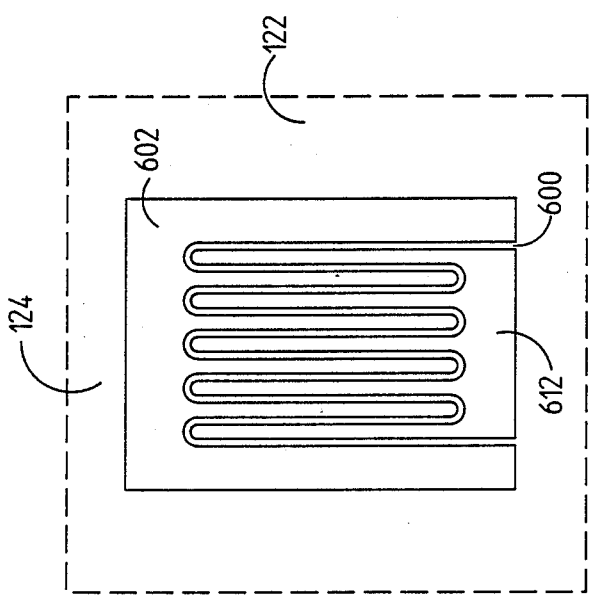
FIG 6

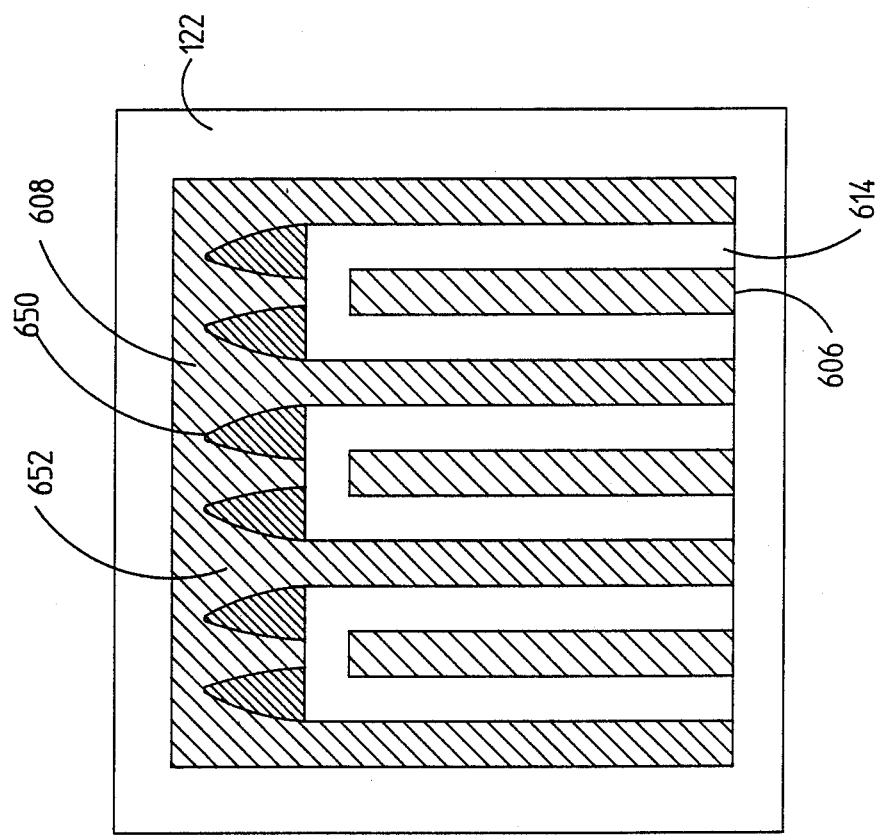

APPARATUS FOR TROUBLESHOOTING PHOTOIMAGE PLATING PROBLEMS IN PRINTED CIRCUIT BOARD MANUFACTURING

BACKGROUND OF THE INVENTION

1. Field of the invention.

The present invention pertains generally to optimization of photoimage and plating processes for printed circuit board manufacturing.

2. Description of the Background.

Electrochemical deposition processes are used in many different manufacturing processes. An electrochemical process typically comprises a plating bath, an anode, and a cathode. The plating bath is a solution of a number of chemicals. Not only does each of the chemicals affect the electrochemical properties of the process, so do the various combinations of the chemicals and their interactions. Also, many other factors individually and in combination affect the process. Some of the other factors are anode placement, cathode placement, temperature gradients, current density gradients, the fluid flow of the solution and ion mass transfer at the surface, composition of the materials used in the plating bath container, and various contaminants. Plating baths, even of the same solution, are individual and distinct. Because of the complexity of the variables affecting the electrodeposit, the electroplating process is very difficult to control only by chemical analysis of the electroplating baths alone.

In order to achieve uniform and predictable electrical and mechanical properties of the electrodeposit, the electroplating processes need to be characterized and controlled. One way of doing this is to use a Hull cell. A Hull cell is a small volume of plating solution to be characterized with a test panel containing a polished metal surface as a cathode. The polished metal surface is positioned at an angle to the anode, in order to cause plating at different current densities along the panel. The current densities for different distances from the vertical edge of the panel were calculated indirectly, by the weight of the deposit, and assumed to be constant for given current. By determining the appearance, and generally the obscurity, of the electrodeposit, which depends on the current density and the bath composition, the bath can be characterized.

One limitation of the Hull cell was its failure to measure directly the current distribution on the cathode. The assumption that the current densities for different distances from the edge of the panel are constant for given current is not entirely correct. The current distribution is not only a function of the current applied, but also a function of the bath composition. An improvement was made to the Hull cell in which the cathode was segmented so the current through each segment could be monitored. One way of monitoring the segmented cathode is to put a resistor between each segment and the common power supply. The voltage drop across the resistor is directly related to the current going through that segment by Ohm's Law. A data acquisition instrument like the HP 3497 can be used to scan and monitor the voltage drop which indicates the current density corresponding to each segment during the plating process. In this way, the effects of current density distribution on the electrodeposit and the plating efficiency can be determined. Also, a current versus time graph can be plotted. In this way, the saturation condition can be determined where the plating process becomes diffusion-limited for that segment of the cathode.

Although the segmented Hull cell is useful, in printed circuit board manufacturing it has many limitations. The Hull cell, whether segmented or not, fails to determine the effects of factors introduced by the cathode when the cathode has a pattern of photoresist for plating and nonplating areas, and when the cathode has different width plating areas for each segment. The segmented cathode fails to show the effects of the solution on the photoresist and the effect of photoresist on the electrodeposition in plating areas separated by photoresist.

A segmented cathode with a checkerboard pattern and a gross circular plating feature was developed. These relatively large patterns were used to determine the stability of the resist by the number of photoresist squares which could be pulled off using a standard adhesive tape. The plating uniformity could be established as in the above designs by measuring the thickness of the metal in the gross circular features and by visual inspection of the quality of the plating. This design has limitations since it does not show the effect of photoresist on small geometries and the effect of microcontamination in immediately adjacent plating areas. It also does not show the effect of the photoresist post-development cleaning on the metal deposition and absorption of the photoresist cleaner on lateral surfaces of photoresist subsequently contaminating the metal. Another limitation is inability to determine the effects when the photoresist on the cathode introduces contaminants and fluid flow perturbations within small areas of the surface of the cathode.

Printed circuit boards are complicated cathodes, involving complex designs of interconnect conductor networks for boards that may eventually contain and connect thousands of components or integrated circuit packages. Also, the cathode may be subjected to a myriad amount of processes during the photoimaging. The photoimage process involves applying a pretreatment to the surface for adhesion of the photoresist, exposure of the photoresist, development of the photoresist, rinse or development stop, baking of the photoresist, post-development clean of the photoresist, and other processes peculiar to particular photoimaging techniques. The cathode surface is directly or indirectly exposed to these processes and the effects on the cathode surface may affect subsequent plating processes. These effects need to be controlled and tested for in order to characterize the plating process. All the present Hull cell designs fail to provide complete and accurate characterization of the current density distribution on the surface of the cathode as a function of cathode line width, of the effect of the fluid agitation on the complex patterns of the cathode, of the effect of the previous cleaning of the printed circuit board and of the plating on the stability of the photoresist pattern on the cathode masking areas from the plating process, and of the effect of the previous cleaning of the printed circuit board and the photoresist pattern on the plating process. Further, no present design provides a quantitative measure of the resolution of the combined photoimaging and plating processes.

Summary of the Invention

The present invention overcomes the limitations of the prior art by providing an apparatus for testing an electrochemical reaction process in the manufacture of printed circuit boards, the apparatus comprising a printed circuit board having a dielectric portion and an electrode portion, the electrode having a surface; a photoresist test pattern fabricated on the electrode surface portion of the printed circuit board, the test pattern comprising a serpentine line of photoresist separating two plating areas from each other, and spaces between the portions of the line, the serpentine line and spaces arranged so as to determine a current density distribution on the electrode surface as a function of a photoresist line width and a plating space width.

The invention differs from the previous methods and apparatus by providing quantitative information for the combined effects of photoresist, image design and configuration, plating pretreatment, plating bath composition, current density, and type of agitation on the current distribution, plating thickness uniformity, and appearance of the deposition, plating efficiency and photoresist integrity (stability and withstanding the electroplating process conditions).

BRIEF DESCRIPTION OF THE DRAWINGS

FIG. 4 illustrates one embodiment of the invention.

FIG. 6 show two embodiments of the device used to show current density distribution for photoresist lines and plating spaces.

DETAILED DESCRIPTION

Figure 1:
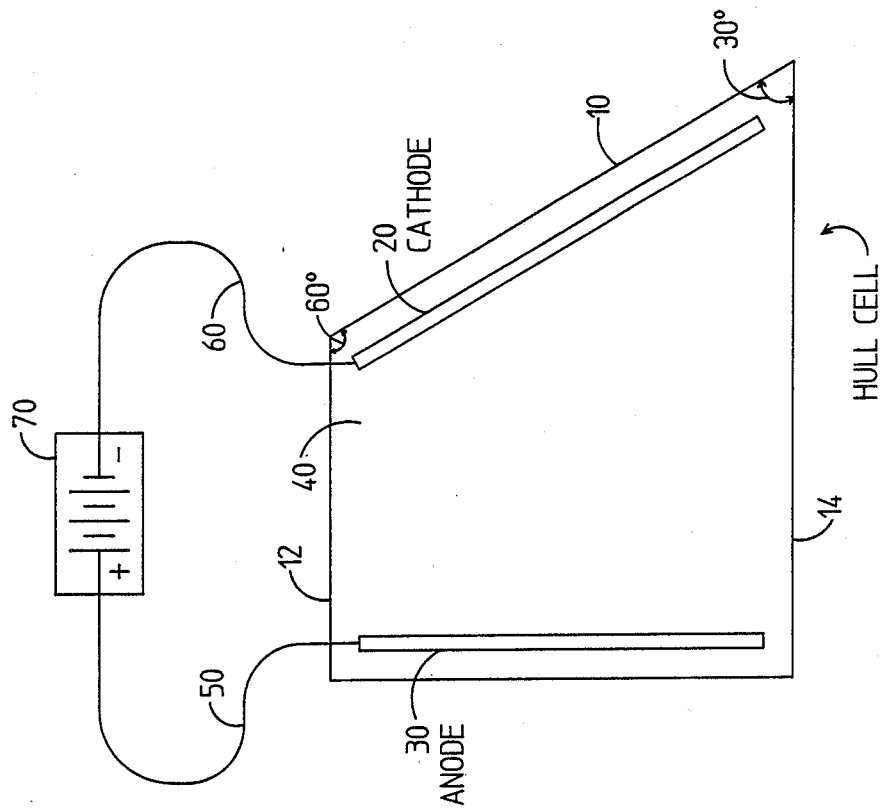
FIG. 1 is an illustration of a typical Hull cell.

FIG. 1 shows a standard Hull cell. A Hull cell has a bath container 10 enclosing an ionic solution 40. The bath container has a sidewall 12 approximately one-half the length of the sidewall 14. Two of the interior angles are sixty (60) degrees and thirty (30) degrees as shown. Immersed in the ionic solution is an anode 30 and a cathode 20 to be plated. Attached to the anode and cathode are leads to complete the circuit to a power supply 70.

Figure 2:
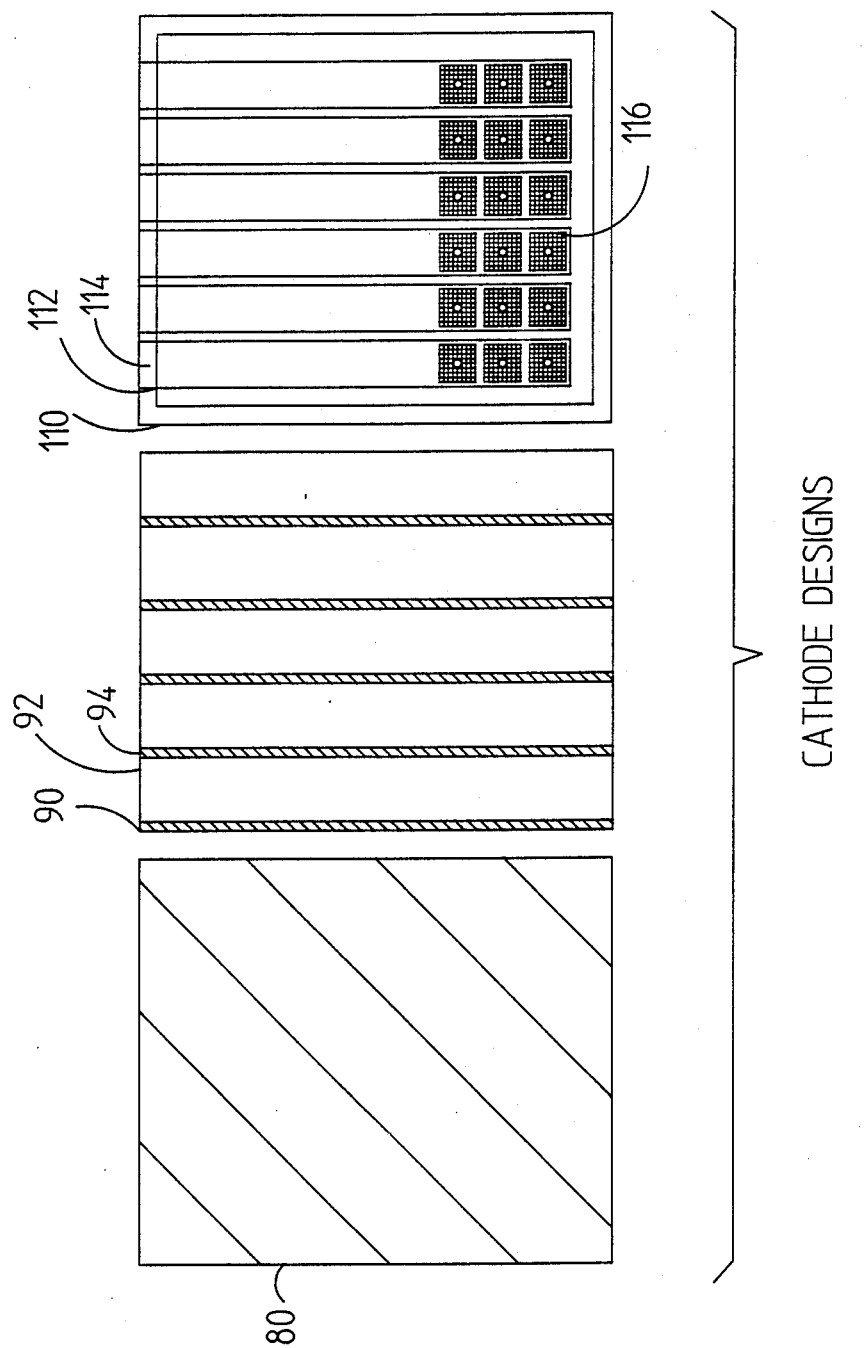
FIG. 2 is an illustration of the present designs of cathodes for electroplating.

FIG. 2 shows different cathode designs. The original Hull cell cathode is a blank metal plate 80. The leads were connected directly to the piece of metal. After plating the quality of the process was determined by visually examining the plated surface and assuming current densities as a function of the current applied to the panel and the distance from the vertical edge. "The Hull Cell" by Walter Nohse, published by Robert Draper Ltd 1966. Another design 90, is the segmented cathode. The metal to be plated is in segments 92. The carrier material 94 is a dielectric and is not electroplated during the process.

The design 110 is the first to use photoimage pattern 116. The photoimage pattern combines a grid used to test the integrity of the photoresist after the electrodeposition process with large circular areas for measuring the thickness and the appearance of the electrodeposit. The thickness of the plating can be measured by nondestructive methods e.g. beta backscattering methods after the plating process.

Figure 3:
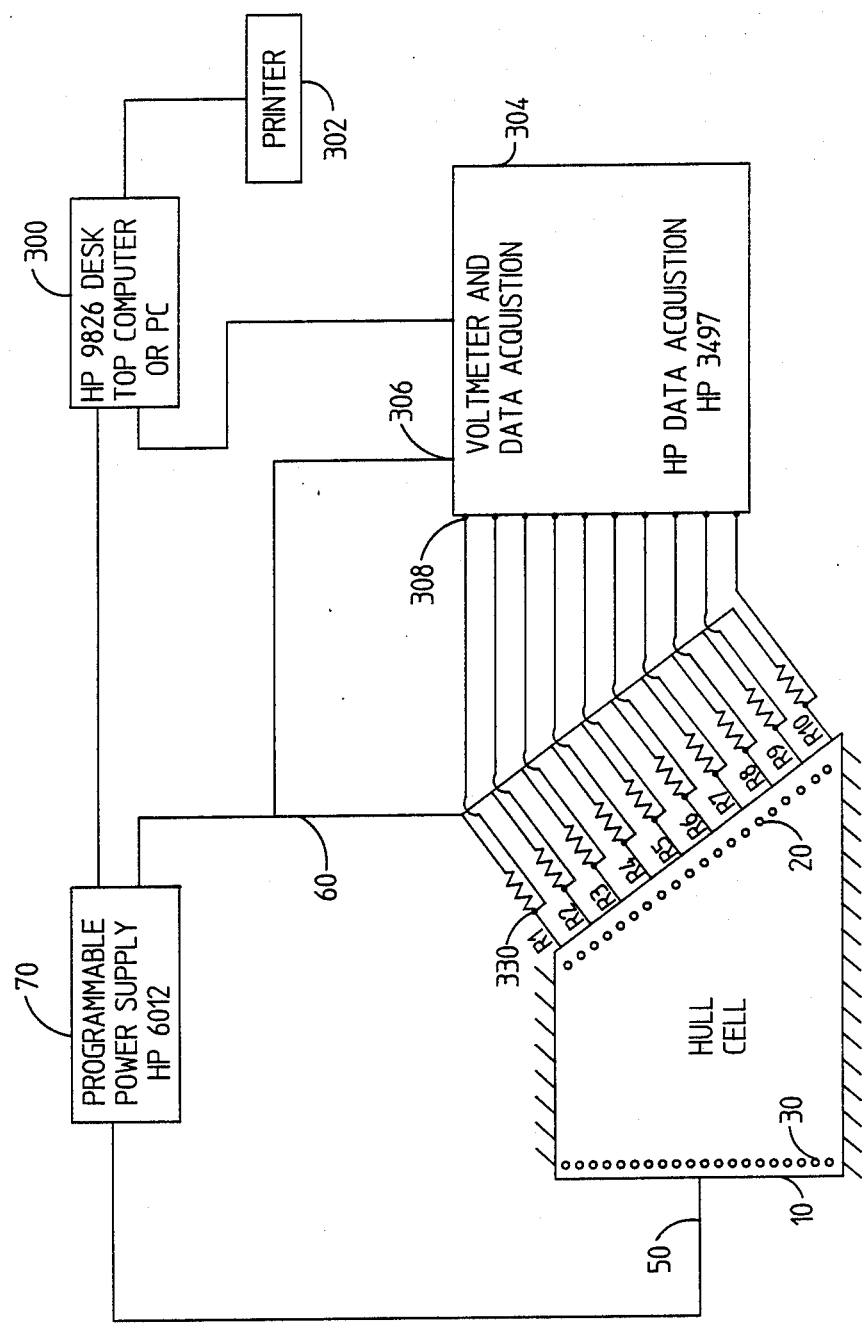
FIG. 3 is an illustration of a Hull Cell using a segmented cathode attached to a Data Acquisition which monitors the current in each segment.

FIG. 3 is a schematic showing the connections for a Hull Cell using a segmented cathode(20). Each segment of the cathode is connected to a resistor(R1 to R10). One end of the resistor R1 is connected to the power supply 70 through conductor 60 and the other end is connected both to the cathode 20 and to a data acquisition unit 304 which measures and records the voltage drop across the resistor R1. The data acquisition unit 304 is referenced to the power supply 306. A programmable power supply 70 can be used like the HP 6012. The voltage drop across the resistor is a direct measure of the current through that segment of the cathode. Quantitative analysis of the current distribution across the cathode as a function of the distance from the anode can be done. The data can be downloaded for processing to a desktop computer(300) like an HP 9826 or a PC like the HP Vectra. The results can be printed out with a printer 302.

FIG. 4 shows an initial embodiment on a segmented cathode. A photoresist pattern 422 on the test printed circuit board 400 masks each segment 412 to 420 of the cathode to provide a space plating area 402 through 410. In this particular embodiment, each space has a different width, but the same length compared to the spaces on the other cathode segment. During the plating process the current through each segment is monitored and recorded with respect to time. A current density can be calculated since the current and plating area are known for each segment. The current through each segment is derived from knowing the voltage drop across the resistor for that segment. From Ohm's law IR=V, the current to that segment can be calculated, I=V/R. The current density(i) is the current(I) divided by the plating area(A) of that segment, i=I/A. From the current density and the plating time, using Faraday's law, the plating thickness can be calculated for each segment. The thickness is proportional to the product of the current density and the time, and inversely proportional to the specific gravity of the given metal deposited. Thickness(T) equals the current density(i) times the duration(t) times the grams per atom of the deposited metal(gm/atom) times the number of atoms of the metal deposited per unit of charge(atoms/electron) times the volume per unit gram(cubic centimeter per gram), T=i*t*grams per atom*atoms per electron*cubic centimeter per gram.

Next, the efficiency of the process can be determined. First the actual thickness is measured by using nondestructive measurement methods e.g. beta backscattering techniques, or cross-sectioning. The efficiency is calculated by taking the ratio of the actual thickness to the calculated thickness.

As another result of this test, the current density distribution can be determined by taking the ratio of the current densities on different segments of the cathode.

In this way, the electrodeposition process can be characterized and optimized, and design rules can be defined regarding plating line width ratios for a given plating thickness tolerance. The plating thickness tolerance is the plating thickness uniformity expected for given line width ratios.

FIG. 5 shows the present invention. In one embodiment the present invention would be used with the segmented cathode and on some segments there would be a pattern in the photoresist layer 122. A preferred embodiment would have ten segments with an identical photoresist pattern on each segment.

The pattern would contain a test pattern 124, 126 and 128,130 in order to check for shorts caused by photoresist "lift-up" during plating. The "lift-up" could be the result of bad adhesion of the photoresist to the metal base, the developing before the plating process, the cleaning before electroplating, the attack of the plating solutions on the photoresist, reduced efficiency of the electroplating due to the photoresist microcontamination of the electrolyte, impurities, agitation anomalies, and interaction of the plating and the photoresist sidewalls. The pattern is arranged in order for there to be substantially orthogonal components. Here, device 124,126 is arranged to be 90 degrees rotated from device 128,130 with 124,126 being substantially horizontal with respect to gravity during the plating process and device 128,130 being substantially vertical with respect to gravity during the plating process. This pattern can be used to provide information for the combined effect of current density, photoresist, photoresist treatment, pre-cleaning, bath composition, and agitation on the quality of the deposit, photoresist stability, efficiency, etc.

In another embodiment, the image on adjacent segments will have the same plating area, but different line widths. This pattern can also be used to check the efficiency of the process for a given photoresist line width and plating space dimension, and the plating thickness uniformity for given dimensions of photoresist line width and plating area space.

Figure 5A:
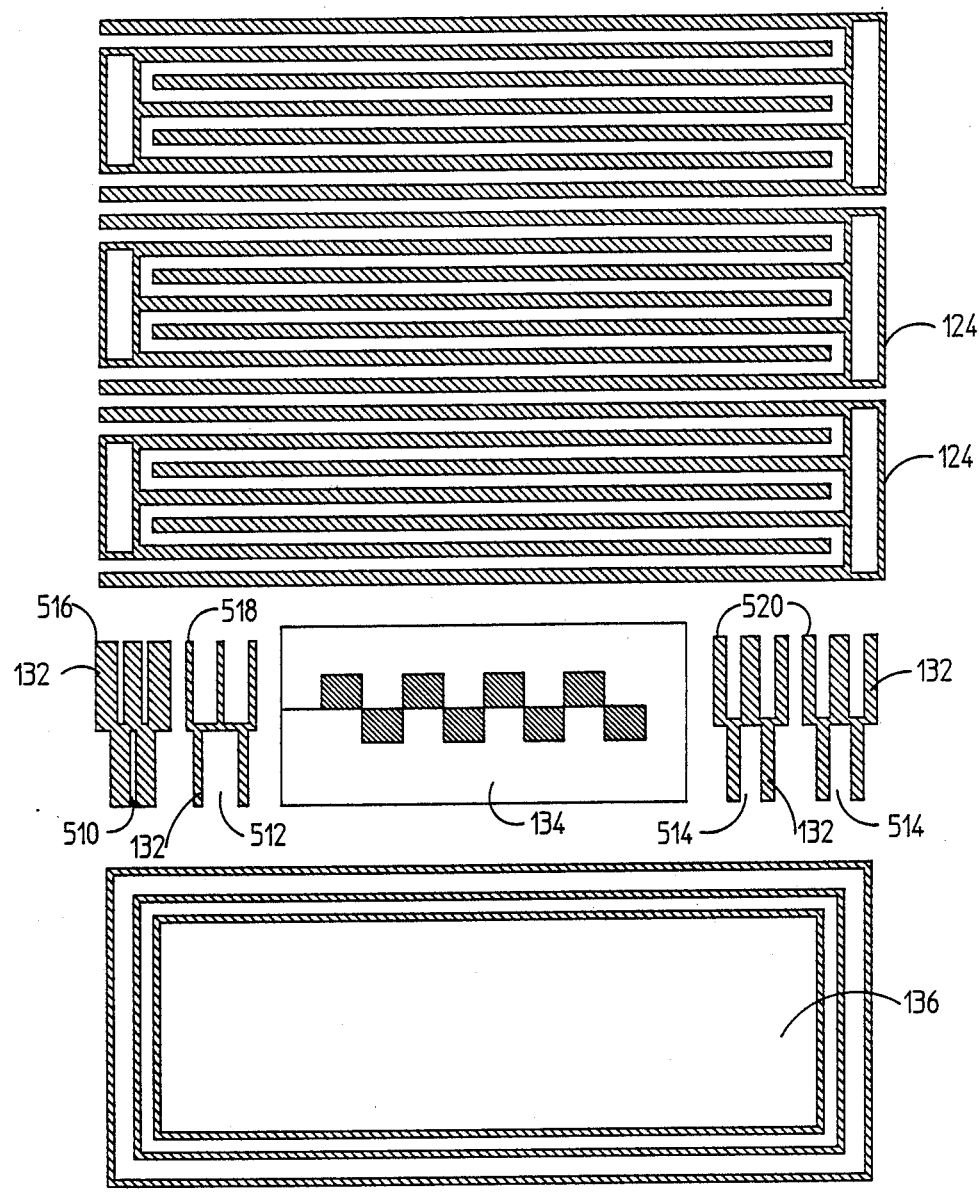
FIG. 5 is an illustration of the details of an embodiment of the invention.
Figure 5B:
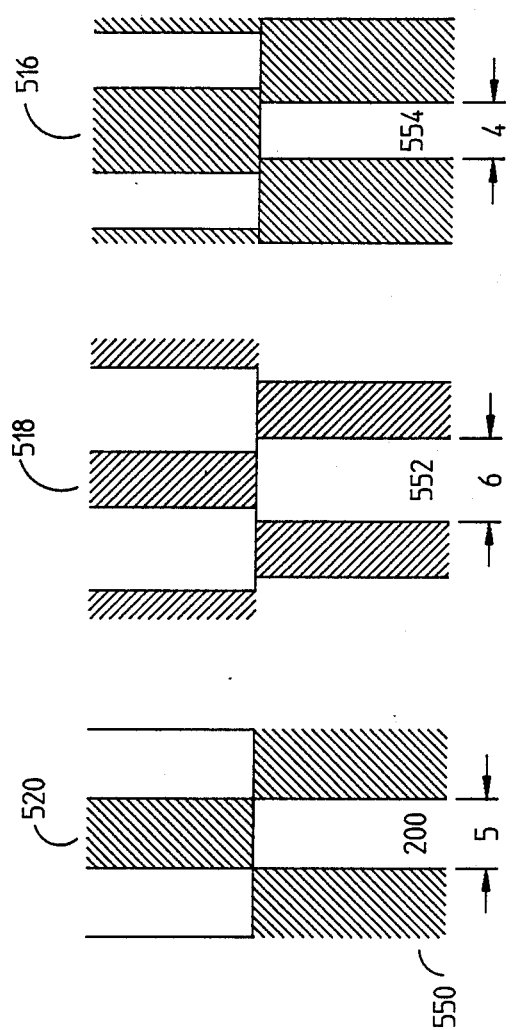

Device 132 checks the resolution of the complete process. FIG. 5A shows a close-up of the resolution pattern 132. The pattern is a group of patterns designed to complement each other in order to bound the resolution. The plating area spaces are a different width, plating space 510 is narrower than the two 514 spaces and space 512 is wider than the two 514 spaces, both 514 spaces are equal. The photoresist fingers of device 132 are designed with differing widths inverse of that their corresponding spaces, line 516 is wider than 520, line 518 is narrower than 520 for each set. The widths differ by a preselected amount so that the resolution can be quantified. The resolution can be determined by visual inspection which can be aided by a microscope. FIG. 5B shows a resolution of 5 since edge 200 is a straight line from one side of the pattern to the other side. Another way of putting it is the photoresist edges of the photoresist bars line up with no offset. The resolution can be interpolated and extrapolated if none of the patterns have a perfectly straight line edge.

Device 134 is a design to test the photoresist integrity after plating. This device is a chain of photoresist squares. The integrity is determined by how easily the photoresist squares are pulled from the surface.

The above pattern can be combined with other patterns like the large rectangular plating area 136. Previous non-destructive techniques, like beta backscattering methods, for measuring the thickness can be used on these patterns. By determining the thickness and measuring the current density and the plating time, the efficiency of the plating can be calculated. Also, this area can be used for visual inspection of surface brightness, roughness, and dendrites.

During the plating process, the current through that segment is monitored and recorded as shown in FIG. 3. An identical set of patterns on another plate, on a segment corresponding to the first segment is plated. During that second plating process, the current is monitored and recorded. In this way, the current distributions can be compared as a ratio of current densities of two different segments. The effects of different photoresist cleaners, photoimaging processes, agitation schemes, and bath composition can be compared as to the different current distributions produced from one plate to the other plate. Corresponding segments can be compared as can the overall variation from segment to segment. Known statistical techniques can be used to determine significance and probable magnitude of the variations. Two other interpretations can be used using the serpentine pattern: appearance and electric probe for shorts. These interpretations are described in FIG. 6.

FIG. 6 shows more complex embodiments of device 124. The first design is a serpentine line of photoresist 600 separating two areas 602 from 612 for plating in such a way as to provide alternating lines and spaces. Each line and space can vary in width, or the lines and spaces can be constant, but each cathode segment may have a different width lines and spaces depending on the goal of the test. The second design is a rectangular serpentine line of photoresist 614 separating two plating areas 606 from 608. An equivalent way to describe it would be to look at the plating area shape. Two plating areas, designed like multiple prong forks, interlocking and separated by photoresist. A segment of a cathode could have many of these inventions. Some of the patterns could be turned at various angles relative to the cathode and the agitation of the system. For example, three designs could aligned side by side in one direction. Another row of patterns could be oriented with a ninety degree rotation and set side by side three to the row.

Besides monitoring and recording the current through the segments containing this pattern and comparing the current from one plate to the other plate, two other interpretative procedures can be used. First, the pattern can be examined using a magnifying means like a microscope. FIG. 6A shows some of the effects which can be observed. The effects of micrcontamination can be seen in the plating areas between the photoresist lines. The photoresist lines can create shadow effects 650 in the direction of the agitation flow. As the solution of the bath depletes, it moves up. As it moves up, it is channeled 652 by the photoresist lines 614. The channeled solution carries the photoresist byproducts which are soluble in the solution. The appearance of the top of the channel larger plating area 608 indicates the effects of this process. This appearance can be compared to other patterns processed differently. A judgment can be made based on a particular deposit using standard brightness level interpretations or etch resistance capability.

Another interpretation procedure is to place voltmeter probes on the two large plating areas of each serpentine pattern. Theoretically, the resistance should be very large, if not infinite. Shorts and microshorts can be electrically measured in this way since the presence of shorts will reduce the resistance. Resistance can be compared from one pattern to another pattern on a different printed circuit board. Different processes can be compared.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An Apparatus for testing an electrochemical reaction process in the manufacture of printed circuit boards, the apparatus comprising:
   a printed circuit board having a dielectric portion and an electrode portion, the electrode having a surface;
   a photoresist test pattern fabricated on the electrode surface portion of the printed circuit board, the test pattern comprising a set of lines of photoresist separating two plating areas from each other, and spaces between the portions of the lines, the lines and spaces arranged so as to determine a current density on the electrode surface as a function of a photoresist line width and a plating space width.

2. The Apparatus of claim 1 wherein the set of lines comprises a serpentine line separating the first plating area from the second plating area, the first plating area not being designed to be electrically connected to the second plating area, each area being connected to a separate contact pad for electrical test so as to determine the resistance between the first plating area and the second plating area.

3. The Apparatus of claim 1 wherein the photoresist test pattern further comprises a plurality of plating areas of differing widths alternating with a plurality of photoresist bars and opposing bars of different widths, the plurality of plating areas arranged for determining the resolution of the combined processes so that when the edge of a photoresist bar aligns with the opposing bar, the resolution is the width of the plating area.

4. The Apparatus of claim 1 wherein the photoresist pattern further comprises a plurality of substantially rectangular shape photoresist islands separated by substantially rectangular plating areas for determining the integrity of the photoresist process during the plating process.

5. The Apparatus of claim 2 wherein, the photoresist test pattern further comprises a second serpentine line of photoresist, the second line separating a second pair of areas, the serpentine line having a width and arranged so as to form a line and spaces having different widths than the first serpentine line and the first set of areas, each area connected to a separate contact pad for electrical test so as to determine the resistance between the first plating area and the second plating area.

6. The Apparatus of claim 5 wherein the photoresist test pattern further comprises a plurality of plating areas of differing widths alternating with a plurality of photoresist bars and opposing bars of different widths, the plurality of plating areas arranged for determining the resolution of the combined processes so that when the edge of a photoresist bar aligns with the opposing bar, the resolution is the width of the plating area.

7. The Apparatus of claim 5 wherein the photoresist pattern further comprises a plurality of substantially rectangular shape photoresist islands separated by substantially rectangular plating areas for determining the integrity of the photoresist process during the plating process.

8. The Apparatus of claim 2 wherein the printed circuit board having an electrode portion comprises a segmented electrode comprising a plurality of electrode portions separated by the dielectric portion, some of the segments having the photoresist test pattern.

9. The Apparatus of claim 8 wherein, for two segments having a first and a second segment of the electrode, the photoresist pattern having patterns with equal plating area for the second segment has serpentine line and area widths different from the line and area widths of the first segment.

10. The Apparatus of claim 9 wherein the photoresist test pattern further comprises a plurality of plating areas of differing widths alternating with a plurality of photoresist bars and opposing bars of different widths, the plurality of plating areas arranged for determining the resolution of the combined processes so that when the edge of a photoresist bar aligns with the opposing bar, the resolution is the width of the plating area.

11. The Apparatus of claim 9 wherein the photoresist pattern further comprises a plurality of substantially rectangular shape photoresist islands separated by substantially rectangular plating areas for determining the integrity of the photoresist process during the plating process.

12. A method of optimizing an electrodeposit process for printed circuit boards with photoresist patterns, the method comprising the steps of:
    photoimaging a photoresist test pattern on an electrode surface portion of a test printed circuit board designed to be used in a Hull Cell, the photoresist pattern comprising a line of photoresist separating a first plating area from a second plating area, the line constructed and arranged to provide a plating space between a first portion and a second portion of the line;
    placing the test printed circuit board in a Hull Cell as one of the electrodes, the Hull Cell comprising the plating bath to be used in production of printed circuit boards;
    attaching a current monitoring and recording means to the test printed circuit board for the electrode circuit portion with the photoresist test pattern
    electrodepositing on the test printed circuit board;
    monitoring and recording the current during the electrodeposition;
    measuring the time for plating;
    calculating a current density on the test printed circuit board and calculating a calculated plating thickness;
    removing the test printed circuit board after electrodepositing from the Hull Cell;
    measuring an actual plating thickness;
    comparing the actual plating thickness to the calculated plating thickness.

13. The method of claim 12 wherein the method further comprises the steps after monitoring and recording the current during the electrodeposit:
    removing the test printed circuit board after electrodepositing from the Hull Cell;
    measuring the resistance between the first plating area and the second plating area that are separated by the photoresist line.

14. The method of claim 12 wherein the method further comprises the step of determining the efficiency of the electrodeposition by taking the ratio of the actual thickness to the calculated thickness.

15. The method of claim 12 wherein the method further comprises the steps of:
    photoimaging, during photoimaging of the photoresist test pattern, the pattern further comprising a plurality of substantially rectangular shape photoresist islands separated by substantially rectangular plating area for determining the integrity of the photoresist process during the plating process;

applying an adhesive material to the photoresist islands after removing the test printed circuit board after electrodepositing from the Hull Cell;

pulling off the adhesive material; and visually inspecting the photoresist islands.

16. A method for optimizing and characterizing an electrodeposition process for printed circuit boards with photoresist patterns, the method comprising the steps of:

photoimaging a photoresist test pattern on an electrode surface portion of a test printed circuit board with a plurality of electrodes separated by a dielectric portion, designed to be used in a Hull Cell, the photoresist pattern comprising a line of photoresist separating a first plating area from a second plating area, the line having a width constructed and arranged to provide a plating space between a first portion and a second portion of the line;

placing the test printed circuit board in a Hull Cell as one of the electrodes, the Hull Cell comprising the plating bath to be used in production of printed circuit boards;

attaching a current monitoring and recording means to the test printed circuit board for the electrode circuit portion with the photoresist test pattern;

electrodepositing on the test printed circuit board;

monitoring and recording the current during the electrodeposition;

measuring the time for plating;

calculating a current distribution as a ratio of a first current density associated with a first segment to a second current density associated with a second segment on the test printed circuit board and calculating a calculated plating thickness;

measuring an actual plating thickness;

calculating a plating thickness uniformity as a ratio of the actual plating thickness of the first segment to the actual plating thickness of the second segment.

17. The method of claim 16 wherein the method further comprises the step of measuring the ratio of the current density of a third segment to a fourth segment with different line widths and the same plating area than the third segment.

18. The method of claim 16 wherein the method further comprises the steps of:

photoimaging, during photoimaging of the photoresist test pattern, the pattern further comprising a plurality of substantially rectangular shape photoresist islands separated by substantially rectangular plating areas for determining the integrity of the photoresist process during the plating process;

applying an adhesive material to the photoresist islands after removing the test printed circuit board after electrodepositing from the Hull Cell;

pulling off the adhesive material; and visually inspecting the photoresist islands.

19. A method for determining a resolution of a printed circuit board photoimage and electrodeposit process using a test printed circuit board having a plurality of sets of a device comprising a first alternating photoresist bar and plating space pattern interdigitating with a second alternating photoresist bar and space pattern, the plating space of the first pattern is opposite the photoresist bar of the second pattern, at least three of the sets having different plating space widths for providing an indicator of resolution of the processes, a first plating space width preselected to be equal to the width of the opposite photoresist bar, a second plating space width preselected to be wider by a predetermined amount than the opposite photoresist bar, and a third plating space width preselected to be narrower by a predetermined amount than the opposite photoresist bar after the completion of the processes, the method comprising the steps of:

examining the patterns visually;

comparing the widths of the plating spaces to the opposite photoresist bar.

20. The method of claim 19 wherein the method further comprises the step of determining if the equal plating space width is equal to the opposite photoresist bar then resolution equal to the width of the plating space has been achieved.

21. The method of claim 19 wherein the method further comprises the step of determining if the wider plating space width is equal to the opposite photoresist bar then resolution has decreased indicating plating area spaces are too narrow relative to photoresist areas.

22. The method of claim 19 wherein the method further comprises the step of determining if the narrower plating space width is equal to the opposite photoresist bar then resolution has decreased indicating plating area spaces are too wide relative to photoresist areas.

23. The method of claim 19 wherein the method further comprises the step of determining if none of the plating area space widths equal the opposite photoresist bar and further determining which plating area space width is more equal to the opposite photoresist bar than the other plating space widths and opposite photoresist bars, and interpolating when the resolution appears to be between two sets of patterns, and extrapolating when the resolution appears to be beyond one set of pattern.

24. The method of claim 19 wherein the method further comprises the steps of:

photoimaging, during photoimaging of the photoresist test pattern, the pattern further comprising a plurality of substantially rectangular shape photoresist islands separated by substantially rectangular plating areas for determining the integrity of the photoresist process during the plating process;

applying an adhesive material to the photoresist islands after removing the test printed circuit board after electrodepositing from the Hull Cell;

pulling off the adhesive material; and visually inspecting the photoresist islands.

* * * * *